US008521204B2

(12) United States Patent
Klomsdorf et al.

(10) Patent No.: US 8,521,204 B2
(45) Date of Patent: Aug. 27, 2013

(54) SIGNAL CONFIGURATION BASED TRANSMITTER ADJUSTMENT IN WIRELESS COMMUNICATION DEVICES

(75) Inventors: Armin W. Klomsdorf, Libertyville, IL (US); Robert T. Love, Barrington, IL (US); Ernest Schirmann, Lake Zurich, IL (US); Dale G. Schwent, Schaumburg, IL (US)

(73) Assignee: Motorola Mobility LLC, Libertyville, IL (US)

( * ) Notice: Subject to any disclaimer, the term of this patent is extended or adjusted under 35 U.S.C. 154(b) by 2546 days.

(21) Appl. No.: 10/954,583

(22) Filed: Sep. 30, 2004

(65) Prior Publication Data

US 2006/0068830 A1 Mar. 30, 2006

(51) Int. Cl.
*H04B 7/185* (2006.01)
*H04B 7/00* (2006.01)

(52) U.S. Cl.
USPC .......................................... 455/522; 370/318

(58) Field of Classification Search
USPC .......................................... 455/522; 370/318
See application file for complete search history.

(56) References Cited

U.S. PATENT DOCUMENTS

| 6,160,449 | A  | * | 12/2000 | Klomsdorf et al. ........... 330/149 |
| 6,166,598 | A  |   | 12/2000 | Schlueter |
| 6,281,748 | B1 | * | 8/2001  | Klomsdorf et al. ........... 330/129 |
| 6,339,694 | B1 | * | 1/2002  | Komara et al. ............... 455/11.1 |
| 6,417,736 | B1 | * | 7/2002  | Lewyn ........................... 330/297 |
| 7,002,899 | B2 | * | 2/2006  | Azenkot et al. ............... 370/208 |
| 8,000,665 | B2 | * | 8/2011  | Stebbings et al. ......... 455/127.5 |
| 8,280,425 | B2 | * | 10/2012 | Love et al. ...................... 455/522 |
| 8,462,757 | B2 | * | 6/2013  | Scholand et al. ............. 370/342 |
| 2003/0067883 | A1 | * | 4/2003 | Azenkot et al. ............... 370/252 |
| 2004/0147276 | A1 | * | 7/2004 | Gholmieh et al. ............. 455/522 |
| 2005/0078743 | A1 | * | 4/2005 | Shohara ........................ 375/219 |
| 2006/0057978 | A1 | * | 3/2006 | Love et al. .................. 455/127.1 |

OTHER PUBLICATIONS

Stephen Mann, Mark Beach, Paul Warr, Joe MC Geehan; "Increasing Talk-Time With Efficient Linear PA'S"; IEEE, Feb. 10, 2000; 22 pages.
Patrick Hosein, Tao Wu; "Dynamic Power Headroom Threshold for Mobile Rate Determination in a CDMA Network"; IEEE, May 2004; 5 pages.
XP-002355569; "Comparison of PAR and Cubic Metric for Power De-Rating"; TSG RAN WG4 #31; May 10, 2004; 6 pages.
"Comparison of PAR and Cubic Metric for Power De-rating", TSG RAN WG1 #37, Montreal, Canada, Tdoc# R1-040642, AH64: Enhanced Uplink 6.1Motorola, May 10-14, 2004, 7 pages.

* cited by examiner

*Primary Examiner* — Bobbak Safaipour

(57) ABSTRACT

A method in a wireless communication transmitter including a baseband processor (310) that configures the transmitter for a particular signal configuration, and a headroom controller (350) for adjusting transmitter headroom based on the particular signal configuration. In one embodiment, the headroom is controlled based on a power metric, for example, a $3^{rd}$ order polynomial or a peak to average ratio (PAR) metric, that is a function of the signal configuration. In another embodiment, the headroom is adjusted using information in a look up table.

3 Claims, 3 Drawing Sheets

SIGNAL CONFIGURATION BASED TRANSMITTER ADJUSTMENT IN WIRELESS COMMUNICATION DEVICES

FIELD OF THE DISCLOSURE

The present disclosure relates generally to wireless communication transmitters, and more particularly to adjusting transmitter power amplifiers based on transmitter signal configuration, for example, the channel configuration in high speed uplink and downlink data access enabled wireless communication devices, and methods.

BACKGROUND OF THE DISCLOSURE

As data rates increase in wireless communication networks and handsets, the power amplifier (PA) headroom demands placed on transmitters also tends to increase, which decreases overall transmitter efficiency. The effect is a reduction in talk or packet connect times and an increase in operating temperature. The PA headroom is a measure of the power margin available for producing higher levels of RMS output power for a given reference signal or transmitter configuration, and/or for amplifying signals having a higher peak-to-average power ratio (PAR) at a maximum rated RMS power level.

The PA consumes the largest portion of battery power in wireless handsets/devices when operating at or near maximum output power. As wireless data rates increase, handsets/devices will increasingly operate at higher output power levels, further exacerbating thermal and current drain related issues.

U.S. Pat. No. 6,281,748 describes adjusting power amplifier (PA) load impedance based on the modulation/Radio Access Technology (RAT) domain. U.S. Patent Nos. 6,160,449 and 6,166,598, both assigned to Motorola Inc., describe feedback systems where the power amplifier (PA) load impedance or power supply voltage are adjusted based on a peak-to-average power ratio (PAR) metric measured at the PA output.

In a disclosure by Motorola Inc. to the Technical Specification Group Radio Access Network (TSG RAN), R1-040642 on May. 10-14, 2004, a new cubic metric was proposed for evaluating the effect of candidate 3GPP signal configurations on power amplifier (PA) de-rating. Quantitative data suggests that the new cubic metric is a more effective predictor of power de-rating than the peak-to-average ratio (PAR) for at least some signal configurations.

The various aspects, features and advantages of the disclosure will become more fully apparent to those having ordinary skill in the art upon careful consideration of the following Detailed Description thereof with the accompanying drawings described below.

DETAILED DESCRIPTION

Figure 1:
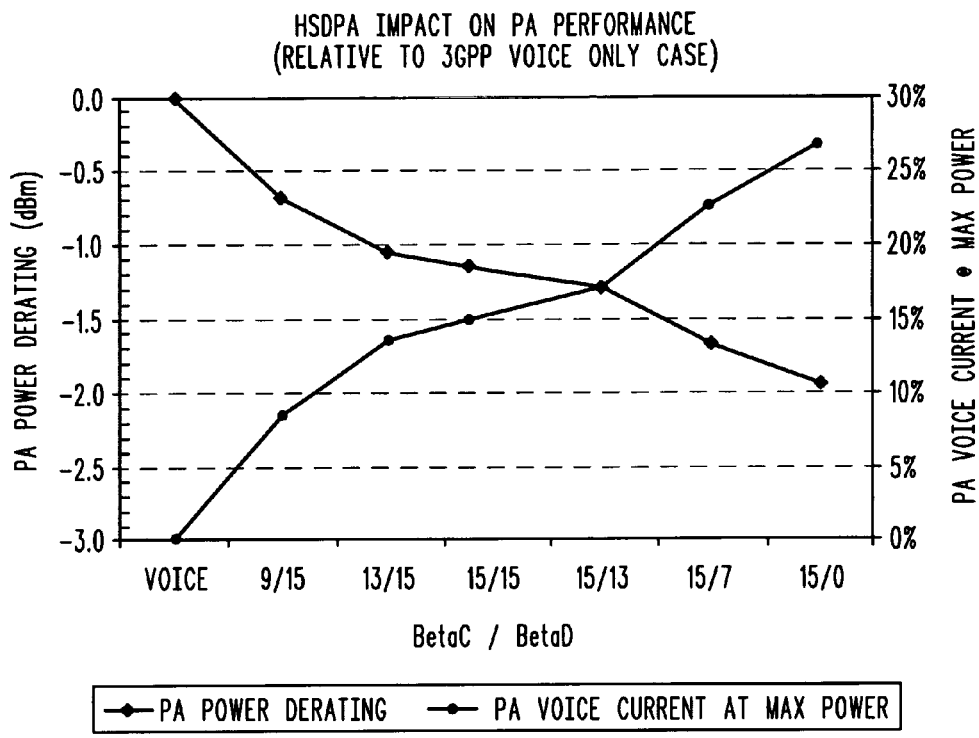
FIG. 1 illustrates an exemplary power amplifier linear power capability de-rating as a function of control/data channel gain ratios.

FIG. 1 illustrates PA linear power capability de-rating as a function of control/data channel gain ratios. Generally, the maximum power at which Adjacent Channel Leakage Ratio (ACLR) and error vector magnitude (EVM) level limits can be met for a power amplifier (PA) varies with the channel or signal configuration. FIG. 1 also illustrates that the linear power capability of a PA can be degraded by as much as 2 dB over the full range of 3GPP Release 5 High Speed Downlink Packet Access (HSDPA) channel configurations.

First generation 3GPP WCDMA power amplifiers (PAs) were designed to provide linear amplification for a basic signal configuration including one control channel and one data channel with a known peak-to-average ratio (PAR) of approximately 3 dB. With this configuration, maximum power and efficiency could be optimized simultaneously while maintaining acceptable Adjacent Channel Leakage Ratio (ACLR) and error vector magnitude (EVM) levels. Future wireless communications protocol signal configurations will increase dramatically. The implementation of 3GPP WCDMA Release 5 High Speed Downlink Packet Access (HSDPA), for example, requires an additional channel, which represents the need to support approximately 1 dB of additional PA headroom. Release 6 High Speed Uplink Packet Access (HSUPA) will include up to five (5) code-multiplexed channels, which will require still more PA headroom. Other applications, for example, future 3GPP releases based on orthogonal frequency division multiple access (OFDMA) PHY could increase PA headroom requirements by as much as 4 dB or more. Power amplifier (PA) efficiency will be generally degraded as the headroom requirements on the PA increases.

In one embodiment, power amplifier (PA) headroom is adjusted dynamically based on the signal configuration, which may be changed dynamically, for example, on a frame by frame and/or on a slot by slot basis. Optimization of the PA headroom reduces current drain and power dissipation. Adjusting PA headroom could also be an enabler for higher power class operation.

In one embodiment, the PA headroom is adjusted using a power metric that is dependent on the signal configuration. One exemplary power metric suitable for adjusting PA headroom is a polynomial based metric. Simulation and bench-level engineering suggests that a primary cause of adjacent channel leakage in some amplifier circuits is saturation that produces clipping in the modulated waveform. This clipping causes a marked increase in the odd harmonic content of the modulation, with the third order non-linearity being predominant. Thus in one embodiment, the polynomial power metric is devoid of even ordered terms (i.e., powers of 2, 4, 6 . . . ). Ignoring any other causes of non-linearity, the amplifier voltage gain characteristic may be written as:

$$v_o(t) = G_1 * v_i(t) + G_3 * [v_i(t)]^3$$

In the expression above, the $G_1$ coefficient is the linear gain of the amplifier, and the $G_3$ coefficient is the non-linear gain. The coefficients depend only on the amplifier design, and do not change as a function of the signal used for $v_i(t)$. If the signal for $v_i(t)$ is a 3 GPP modulated RF carrier, then the cubic term above will generate several types of degradation to the output signal. On-channel distortion terms that contribute to error vector magnitude (EVM) will be produced, as well as signals at the third harmonic of the carrier frequency, and signals in the upper and lower adjacent channel bands. For a given amplifier, the total energy in the cubic term will be determined only by the $v_i(t)$ signal, and this total energy will be distributed among the various distortion components in some predefined, signal dependent way.

In order to generate a cubic polynomial power metric that reflects the power in the cubic term above, the given voltage signal is first normalized to an RMS value of 1.0 and then cubed. In other embodiments, higher order metrics, for example, $5^{th}$ and $7^{th}$ order metrics, etc. may be generated also. The root mean square (RMS) value of the exemplary cubed waveform is then computed and converted to dB.

In one embodiment using a cubic power metric, the amount by which the power capability of a transmitter power amplifier must be de-rated can be approximated by $$\text{De-rating} = [20*\log 10((v\_norm^3)_{rms}) - 20*\log 10((v\_norm\_ref^3)_{rms})]/1.85 \quad \text{Eq. (1)}$$

In Eq. (1), "v_norm" is the normalized voltage waveform of the input signal, and "v_norm-ref" is the normalized voltage waveform of the reference input signal. In one application, the reference input signal corresponds to the signal configuration for voice, but more generally the reference signal will be that corresponding to the most demanding modulation format based on PA headroom, inter-modulation distortion, and linearity considerations. The exemplary de-rating expression also includes an empirical scaling factor of 1.85, which is dependent on PA technology and signal configurations.

Figure 2:
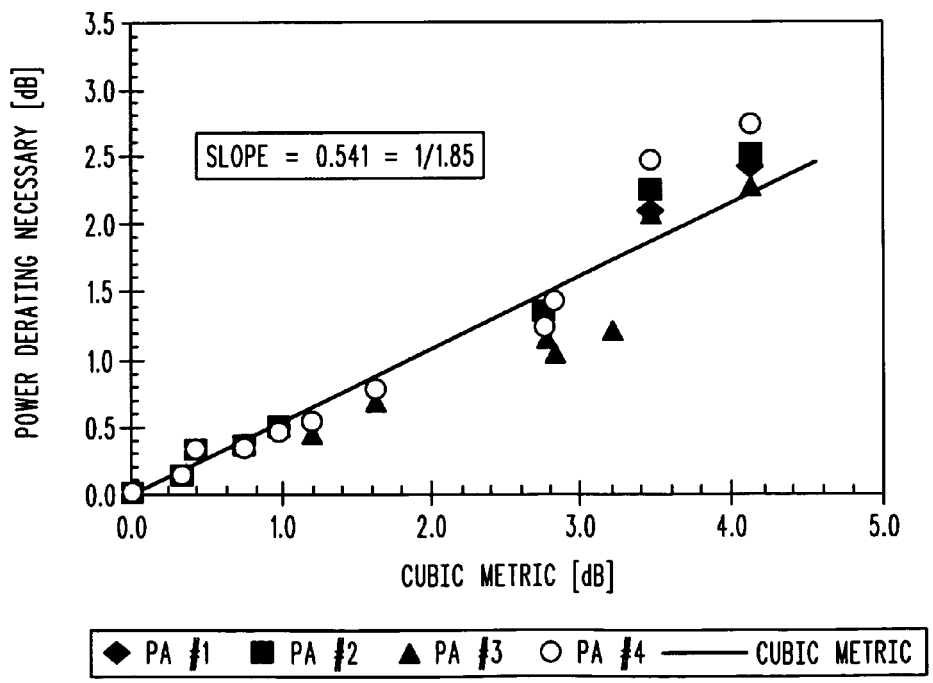
FIG. 2 illustrates a substantially linear relationship between linear power headroom and an exemplary cubic metric.

FIG. 2 illustrates a substantially linear relationship between linear power headroom and the exemplary cubic metric, though further refinements may produce a non-linear relationship. The relationship has been shown to remain relatively consistent over a range of signal conditions and PA technologies, for example, GaAs HBT devices, SiGe HBT devices, and GaAs pHEMT devices among others. The data suggests that the cubic metric is usefully predictive of headroom requirements for at least some signal configurations. For example, the "Cubic Metric" approach to linear power headroom reduction has gained broad acceptance within the 3GPP standards community and is generally considered to be more predictive than a PAR-based approach scheme for 3GPP Release 5 HSDPA and 3GPP Release 6 HSUPA signal configurations.

In other embodiments, the power metric is based on a peak to average power ratio (PAR), which may be a useful headroom predictor for some signal configurations. Use of the PAR power metric to determine PA headroom includes computing a difference between a PAR based function of a particular signal configuration and a PAR based function of a reference signal configuration, as discussed generally above in connection with Eq. (1). The headroom predictability of the PAR based power metric may be improved by appropriately scaling the difference computation based on empirical data as discussed above in connection with the polynomial power metric.

Figure 3:
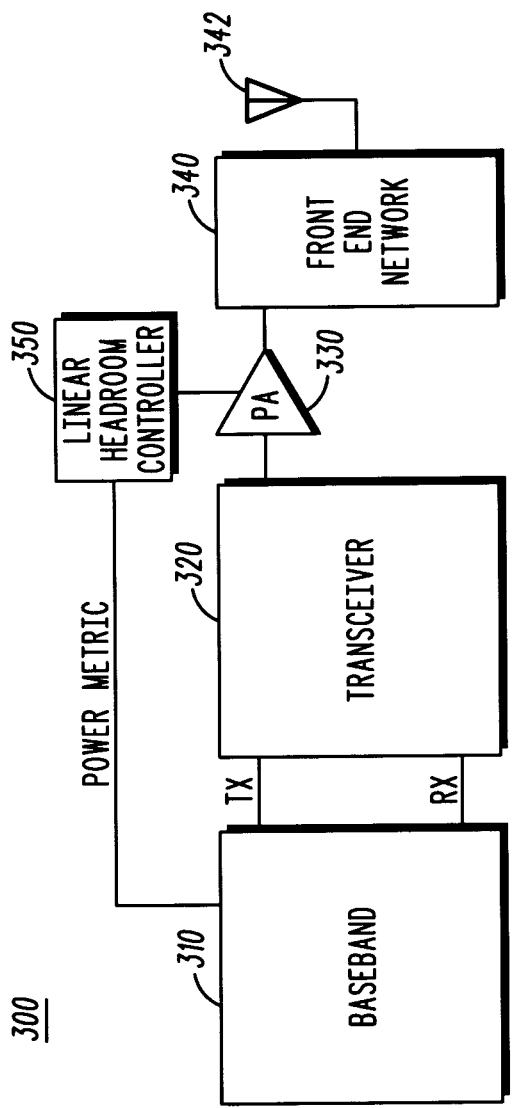
FIG. 3 illustrates an exemplary wireless transmitter system.

The power metric is used to dynamically calculate and adjust the necessary PA headroom according to the instantaneous input signal conditions, for example, the signal or channel configuration. FIG. 3 illustrates an exemplary wireless communication transmitter system 300 including a baseband processor 310 communicably coupled to a transceiver 320 having a transmitter output coupled to a power amplifier (PA) 330 having an output coupled to a front-end network with an antenna 342. A linear headroom controller 350 controls PA headroom based on power metric information received from the baseband processor 310.

In some applications, the wireless communication device potentially changes signal configurations at frame or slot intervals. 3GPP W-CDMA uses 2ms or 10 ms frames, and each slot is 666 microseconds. The wireless communication device obtains signal configuration information from the network in advance of the frame or slot during which the signal configuration change will be made. The baseband processor then computes the power metric predictive of the headroom required for the new signal configuration. In one embodiment, the baseband processor computes the power metric predictive of the headroom only when there is a change in the signal configuration. An exemplary though non-limiting power metric computation by the baseband processor is discussed below.

Figure 4:
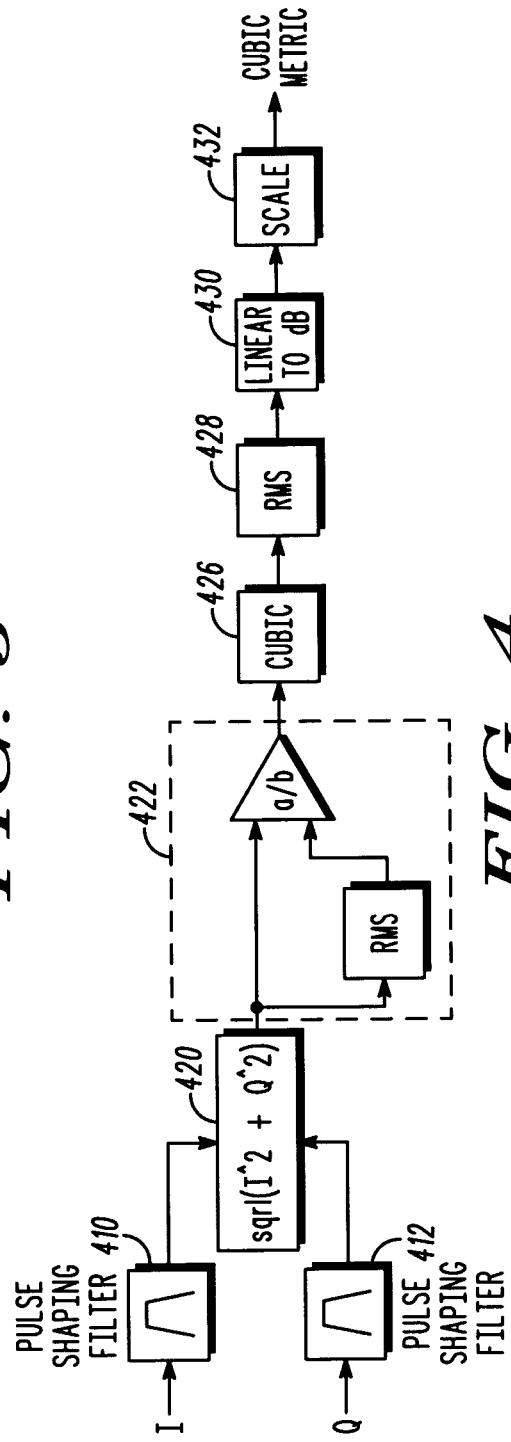
FIG. 4 illustrates an exemplary process for computing a non-linear metric.

The block diagram 400 of FIG. 4 illustrates computation of the exemplary cubic metric within a transmitter baseband processor, for example, the baseband processor 310 in FIG. 3. In FIG. 4, the bold signals paths vary at the modulation rate, while signals from the RMS blocks or following them are computed based on sampling a particular interval of the signal. Sampling over a significant number of modulation symbols/chips is necessary to compute the RMS values to within a desired level of accuracy.

In process flow diagram 400 of FIG. 4, an I/Q modulation stream is the total digital signal prior to pulse shaping. Each I and Q channel is filtered by a corresponding pulse shaping filter 410, 412, respectively, and the complex magnitude at the output of the pulse shaping filter is computed at block 420. The complex magnitude is normalized to an RMS value of 1 at block 422. For some signal configurations it will be possible to pre-compute the normalization parameter (the "b" input in the diagram) from general signal parameters so that its computation on the actual modulated waveform is unnecessary.

In FIG. 4, after normalization, a magnitude signal is cubed at block 426, and the RMS value of the cubed signal is determined at block 428, again from an appropriate length sampling window. The RMS value is converted to dB at block 430, and then scaled at block 432. In one embodiment, the scaling is applied by first subtracting a fixed reference value from the signal, then multiplying by a correlation factor. The fixed reference value is known a priori, and is the value at the input of the scaling block for a reference signal configuration. The correlation factor is a multiplier that relates the output of the calculation block to the actual power amplifier (PA) headroom reduction required. The correlation factor is also known a priori.

There are several possible implementations, with the optimum implementation depending on the required sampling window for the RMS operation and the amount of time that an upcoming signal condition is known prior to its taking effect. The calculation block shown in FIG. 4 may work real-time on the signals as they are changing, thereby providing a cubic metric output with some lag relative to the actual signal change. Another possible implementation is to provide the entire block diagram above in parallel to the actual signal path. In the alternative implementation, the pulse shaping filters would be driven with a separate random data source, but all other signal conditions would match the actual transmitted data path. This would allow the cubic metric to be computed off-line and provided synchronously with the actual data change as long as the upcoming signal conditions were known well enough in advance. While the exemplary power metric computation of FIG. 4 is concerned with the exemplary cubic polynomial based power metric, the baseband processor may also compute other power metrics, for example, one based on PAR, as discussed above.

In the wireless communication transmitter of FIG. 3, upon computation of the power metric, the baseband processor 310 communicates PA headroom information to the headroom controller 350. The headroom controller uses the PA headroom information to control the PA so that it transmits the corresponding signal configuration with an acceptable level of distortion, e.g., Adjacent Channel Leakage Ratio (ACLR), while reducing current drain. This could involve changes in the PA bias, load, supply, or average power out as discussed further below.

In another embodiment, the PA headroom is adjusted based on the signal configuration using a look-up table. The look-up table could be used to store PA load settings corresponding to various modulations/RAT domains. The look up table may also be based on signal power considerations. In applications where the look-up table becomes substantial, for example, in HSUPA where power amplifier (PA) headroom varies with code channel beta settings (5 dimensions) and/or modulation/mapping (4 dimensions), the coarseness of the Table could be increased to reduce its size. In FIG. 3, for example, the headroom controller 350 receives signal configuration and in some embodiments power information from the baseband processor 310. The headroom controller 350 then determines the appropriate headroom based on the signal configuration information and any power information from the look up table and subsequently adjusts the PA headroom when the signal configuration changes. The look-up table may be part of the headroom controller or it may be accessed from memory coupled thereto.

The dynamic adjustment of PA headroom could be accomplished through supply control and/or load control as described below. Each of these techniques could be implemented with continuous or discrete control. Continuous control would enable optimal performance adjustment over a broader range of signal conditions. The technique may be used alone or in combination and might be further enhanced by simultaneously applying bias adjustment.

Figure 5:
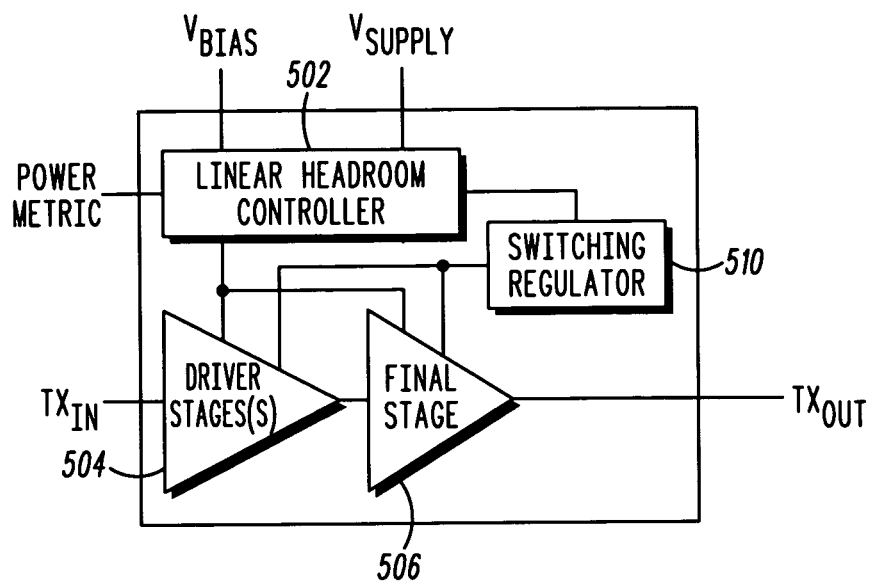
FIG. 5 illustrates an exemplary architecture for adjusting amplifier headroom using supply control.

In FIG. 5, a headroom controller 502 adjusts power amplifier (PA) headroom by selecting an optimal supply voltage and applying it to the PA stages 504 and 506 through an efficient switching regulator 510. For a given Adjacent Channel Leakage Ratio (ACLR) level, linear power headroom (dB) typically varies as the log of the supply voltage:

$$P_{LINEAR} \approx C * \text{Log}_{10}[V_{S2}/V_{S1}]^2$$

The PA would be tuned to achieve the required linear power at the max supply voltage under worst case signal configurations and conditions. For channel configurations with reduced cubic metrics, the voltage supplied to one or more amplifier stage(s) would be reduced. For a typical handset PA, a nominal supply voltage at the PA terminals would be 3.4V at maximum power. To reduce the linear headroom by 1 dB, the PA stage supply voltage would be reduced to ~3.03V (−1 dB≈20*Log$_{10}$[3.03/3.40]).

Figure 6:
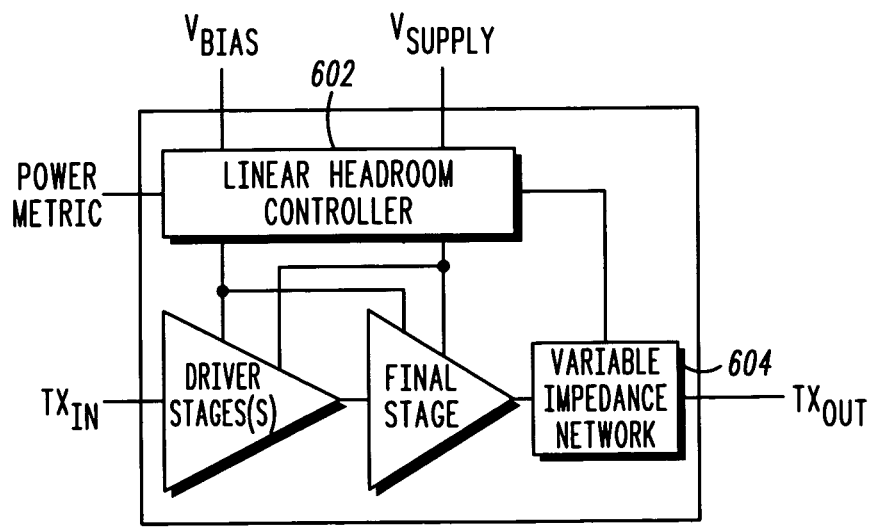
FIG. 6 illustrates an exemplary architecture for adjusting amplifier headroom using load control.

In FIG. 6, a headroom controller 602 adjusts power amplifier (PA) headroom by selecting an optimized PA impedance match in a variable impedance network 604. Tunable capacitance device technologies now exist that allow continuous control of the load impedance. To first order, average linear power capability will vary inversely with the PA load impedance:

$$P_{LINEAR} \approx C * \text{Log}_{10}[V_S^2/(2*R_L)]$$

For signal configurations with reduced cubic metrics, the load would typically be adjusted to a higher impedance level for improved efficiency. The optimum load trajectory for optimum efficiency over a range of powers could be determined through load pull characterization of amplifier active devices. Load impedance adjustment could also be applied to interstage matching networks.

In some embodiments, the power amplifier (PA) bias is adjusted concurrently with the PA headroom adjustment, whether the headroom adjustment is implemented through load and/or supply voltage control. In other embodiments, the PA headroom is adjusted as discussed hereinabove in combination with a power metric information feedback loop control scheme, for example, based on a peak to average ratio (PAR) information detected at the PA output. PAR based feedback control schemes in power amplifiers are known to those having ordinary skill in the art as disclosed generally in the Background of the instant specification.

While the present disclosure and what are presently considered to be the best modes thereof have been described in a manner establishing possession by the inventors and enabling those of ordinary skill in the art to make and use the same, it will be understood and appreciated that there are many equivalents to the exemplary embodiments disclosed herein and that modifications and variations may be made thereto without departing from the scope and spirit of the inventions, which are to be limited not by the exemplary embodiments but by the appended claims.

What is claimed is:

1. A method in a wireless communication transmitter, the method comprising:
    determining transmitter headroom based on a particular signal configuration using a look up table;
    configuring the wireless communication transmitter for the particular signal configuration after determining the transmitter headroom;
    adjusting transmitter headroom for the particular signal configuration based on the transmitter headroom determined using the look up table.

2. The method of claim 1, determining transmitter headroom based on the particular signal configuration and based on signal power considerations using the look up table.

3. The method of claim 1, adjusting at least one of wireless communication device transmitter supply voltage, bias and load based on the particular signal configuration.

* * * * *